US009983372B2

United States Patent
Oomori et al.

(10) Patent No.: US 9,983,372 B2
(45) Date of Patent: May 29, 2018

(54) OPTICAL DEVICE, PRINTED CIRCUIT BOARD

(71) Applicant: SUMITOMO ELECTRIC INDUSTRIES, LTD., Osaka (JP)

(72) Inventors: Kaoru Oomori, Yokohama (JP); Takashi Kojima, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days. days.

(21) Appl. No.: 15/280,740

(22) Filed: Sep. 29, 2016

(65) Prior Publication Data

US 2017/0097478 A1    Apr. 6, 2017

(30) Foreign Application Priority Data

Oct. 1, 2015    (JP) .................................. 2015-196027

(51) Int. Cl.
*G02B 6/42*    (2006.01)
*G02B 6/12*    (2006.01)
(Continued)

(52) U.S. Cl.
CPC ......... *G02B 6/428* (2013.01); *G02B 6/12004* (2013.01); *G02B 6/4268* (2013.01); *H01L 31/02* (2013.01); *H05K 1/184* (2013.01); *G02B 2006/12123* (2013.01); *G02B 2006/12142* (2013.01); *H05K 2201/09072* (2013.01); *H05K 2201/09845* (2013.01); *H05K 2201/10121* (2013.01); *H05K 2203/049* (2013.01)

(58) Field of Classification Search
CPC ............................... G02B 6/428; H05K 1/184
See application file for complete search history.

(56) References Cited

U.S. PATENT DOCUMENTS 5,123,066 A * 6/1992 Acarlar ................ G02B 6/4204
385/14
5,353,364 A * 10/1994 Kurashima .......... G02B 6/4201
257/433
(Continued)

FOREIGN PATENT DOCUMENTS

JP    2008-091522    4/2008

OTHER PUBLICATIONS

Office Action for U.S. Appl. No. 15/280,789 dated Oct. 6, 2017.

*Primary Examiner* — Daniel Petkovsek
(74) *Attorney, Agent, or Firm* — Smith, Gambrell & Russell, LLP.

(57) ABSTRACT

An optical apparatus includes: a semiconductor optical device integrating an optical coupler, an optical element, and an electrical circuit; and a printed circuit board including a main body and a metal piece. The body has first and second openings. The first opening, the metal piece and the second opening are arranged in a direction of a first axis. The first and second openings extend from the front and back faces of the body along the direction to the first and second faces of the metal piece, respectively. The metal piece is supported by the body. The semiconductor optical device is mounted on the first face of the metal piece in the first opening. The body has a supporting face connecting the first side of the first opening with the second side of the second opening and supporting the second face of the metal piece in the first opening.

6 Claims, 14 Drawing Sheets

(51) Int. Cl.
  *H01L 31/02*  (2006.01)
  *H05K 1/18*  (2006.01)

(56) References Cited

U.S. PATENT DOCUMENTS

| | | | |
|---|---|---|---|
| 5,521,992 A * | 5/1996 | Chun | G02B 6/1221 |
| | | | 257/666 |
| 5,856,913 A | 1/1999 | Heilbronner | |
| 7,957,154 B2 | 6/2011 | Ito et al. | |
| 8,382,384 B2 * | 2/2013 | Nekado | G02B 6/4201 |
| | | | 385/14 |
| 9,031,361 B2 * | 5/2015 | Yu | G02B 6/12 |
| | | | 385/14 |
| 2017/0097478 A1 | 4/2017 | Oomori et al. | |
| 2017/0097479 A1 * | 4/2017 | Oomori | G02B 6/12004 |

\* cited by examiner

OPTICAL DEVICE, PRINTED CIRCUIT BOARD

BACKGROUND OF THE INVENTION

Field of the Invention

The present invention relates to an optical device, and a printed circuit board. This application claims the benefit of priority from Japanese Patent Application No. 2015-196027 filed on Oct. 1, 2015, which is herein incorporated by reference in its entirety.

Related Background Art

JP 2008-91522 A1, referred to as "Patent Document 1," discloses a printed circuit board.

SUMMARY OF THE INVENTION

One aspect of the present invention relates to a printed circuit board, which includes: a first laminate structure including a first dielectric core layer, and a first metal layer for grounding or wiring, and the first metal layer being disposed on the first dielectric core layer, the first laminate structure having a second opening; a second laminate structure including a first dielectric core layer, and a first metal layer for grounding or wiring, and the first metal layer being disposed on the first dielectric core layer, the first laminate structure having a second opening, and a metal piece having a first face and a second face opposite to the first face; the first laminate structure, the metal piece and the second laminate structure being arranged in a direction of a first axis, the first opening passing through the first laminate structure, and the second opening passing through the second laminate structure, the first opening having a first side extending in the direction of the first axis, the second opening having a second side extending in the direction of the first axis, the printed circuit board having a supporting face connecting the first side and the second side with each other, the supporting face supporting the second face of the metal piece in the first opening, and the second opening extending along the direction of the first axis to the second face of the metal piece, and the first laminate structure including pad electrodes arranged along an edge of the first opening on a surface of the first laminate structure.

Another aspect of the present invention relates to an optical apparatus, which includes: a semiconductor optical device integrating an optical coupler, an optical element for processing a light beam associated with the optical coupler, and an electrical circuit for processing an electrical signal associated with the optical element; a printed circuit board electrically connected with the semiconductor optical device, the printed circuit board including a main body and a metal piece, the main body having a first opening and a second opening, and the metal piece having a first face and a second face opposite to the first face; and a first electrical component mounted on the printed circuit board, the first opening, the metal piece and the second opening being arranged in a direction of a first axis, the metal piece being supported by the main body of the printed circuit board, the printed circuit board including a front face and a back face opposite to the front face, the first opening extending from the front face along the direction of the first axis, the second opening extending from the back face along the direction of the first axis, the first opening having a first side extending in the direction of the first axis, the second opening having a second side extending in the direction of the first axis, the main body of the printed circuit board having a supporting face connecting the first side and the second side with each other, the supporting face supporting the second face of the metal piece in the first opening, and the second opening extending along the direction of the first axis to the second face of the metal piece, the semiconductor optical device being mounted on the first face of the metal piece in the first opening, and the first electrical component being electrically connected to the semiconductor optical device via a conductor of the printed circuit board.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings, which are.

DETAILED DESCRIPTION

Figure 1:
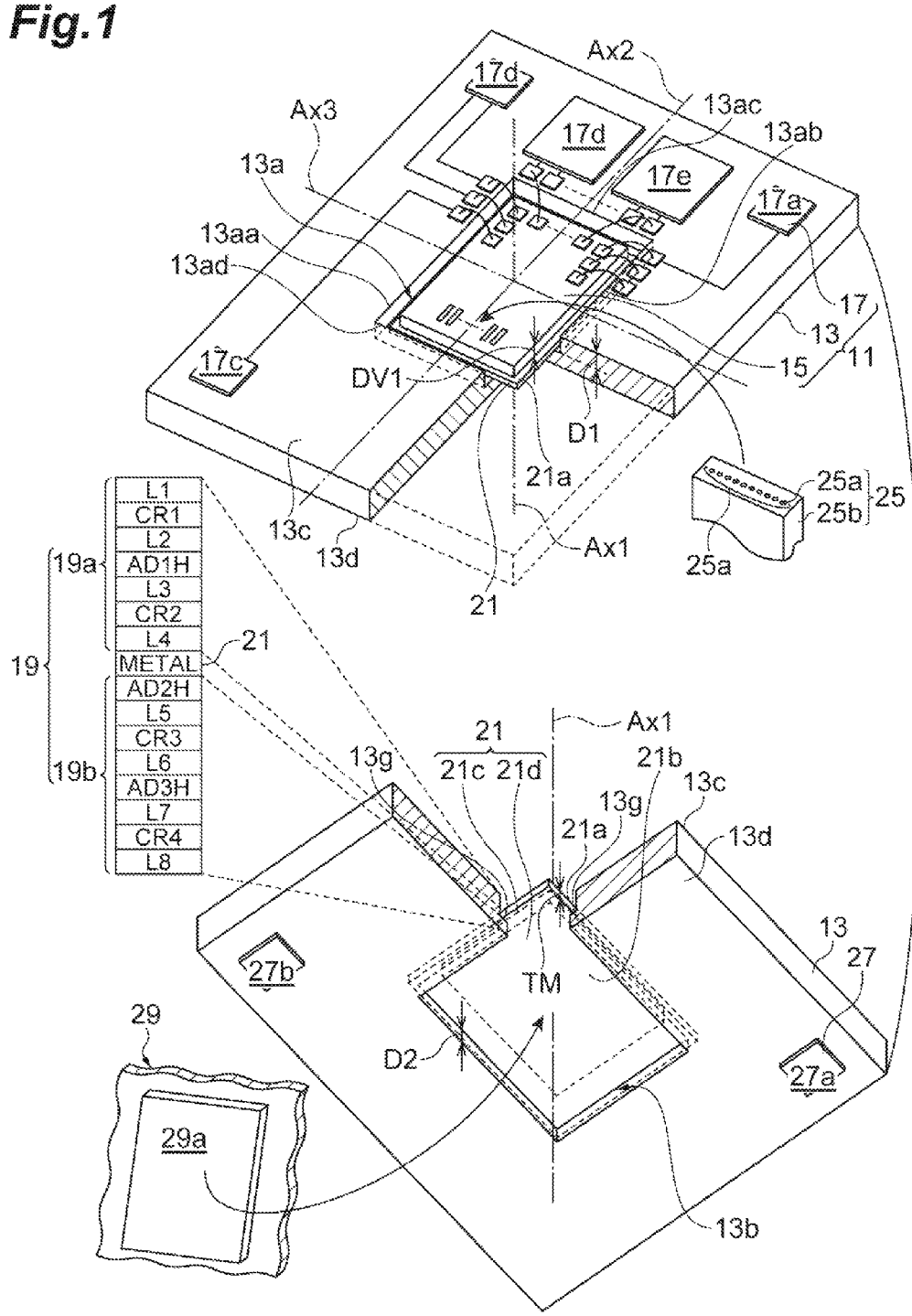
FIG. 1 is a schematic view showing an optical apparatus according to the present embodiment.

A printed circuit board disclosed in Patent Document 1 includes through-holes, and these through-holes are disposed in an area in which electronic components are mounted, and a heat radiator has protrusions which are inserted into the through-holes from the rear side of the printed circuit board. The protrusions thus inserted project from the front surface of the printed circuit board, so that the protruding tips are in contact with respective electronic components therein, and allow the dissipation of heat generated by the electronic components.

The tips protrude with respect to the front surface of the printed circuit board to form a difference in level at the boundary between the protruding tips and the front surface of the printed circuit board. The inventors' teaching reveals that in a technical field in which the electronic components include a semiconductor optical device, the difference in level in the printed circuit board constrains the mounting of the semiconductor optical device.

It is an object of one aspect according to the present invention to provide a printed circuit board providing a mounted semiconductor optical device with a short dissipation path. It is an object of another aspect according to the present invention to provide an optical apparatus including the above printed circuit board.

Specific embodiments according to the above aspects are described below.

An optical apparatus according to an embodiment includes: a semiconductor optical device integrating an optical coupler, an optical element for processing a light beam associated with the optical coupler, and an electrical circuit for processing an electrical signal associated with the optical element; a printed circuit board electrically connected with the semiconductor optical device, the printed circuit board including a main body and a metal piece, the main body having a first opening and a second opening, and the metal piece having a first face and a second face opposite to the first face; and a first electrical component mounted on the printed circuit board, the first opening, the metal piece and the second opening being arranged in a direction of a first axis, the metal piece being supported by the main body of the printed circuit board, the printed circuit board including a front face and a back face, the back face being opposite to the front face, the first opening extending from the front face along the direction of the first axis, the second opening extending from the back face along the direction of the first axis, the first opening having a first side extending in the direction of the first axis, the second opening having a second side extending in the direction of the first axis, the main body of the printed circuit board having a supporting face connecting the first side and the second side with each other, the supporting face supporting the second face of the metal piece in the first opening, and the second opening extending along the direction of the first axis to the second face of the metal piece, the semiconductor optical device being mounted on the first face of the metal piece in the first opening, and the first electrical component being electrically connected to the semiconductor optical device via a conductor of the printed circuit board.

In the optical apparatus, the first opening, the metal piece and the second opening are arranged in the direction of the first axis such that the metal piece can be supported by the body of the printed circuit board. The first opening of the printed circuit board communicates with the second opening thereof, and the printed circuit board has a supporting face which connects the bottom of the first side face of the first opening with the bottom of the second side face of the second opening. This supporting face supports the second face of the metal piece. The arrangement of the first opening, the metal piece and the second opening in the direction of the first axis can restrict the location of the metal piece to the axis on which the first opening and the second opening are arranged in the printed circuit board. The metal piece mounts the semiconductor optical device on the first face thereof in the first opening such that the entire back side of the semiconductor optical device is supported by the first face of the metal piece. The second opening reaching the second face of the metal piece allows the heat dissipation through the second face of the metal piece.

In the optical apparatus according to an embodiment, the printed circuit board includes a first laminate structure and a second laminate structure, the first laminate structure, the metal piece and the second laminate structure are arranged in the direction of the first axis, the first opening passes through the first laminate structure, and the second opening passes through the second laminate structure; the first laminate structure includes a first dielectric core layer, and a first metal layer for grounding or wiring, and the first metal layer is disposed on the first dielectric core layer, and the second laminate structure includes a first dielectric core layer, and a first metal layer for grounding or wiring, and the first metal layer is disposed on the first dielectric core layer.

In the optical apparatus, the first laminate structure, the metal piece and the second laminate structures are arranged in the direction of the first axis such that the first opening of the first laminate structure and the second opening of the second laminate structure aligned with each other and the supporting face supports the metal piece. This arrangement allows the printed circuit board to incorporate the metal piece for mounting without significantly changes in the structure of the printed circuit board that affect the electrical characteristics of the optical apparatus, such as the width of wiring layers and thickness of insulating layers, in each of the first laminate structure and the second laminate structure in the printed circuit board.

The optical apparatus according to an embodiment further includes an optical part having optical waveguides, and a holder holding the optical waveguides. The optical part is supported by the semiconductor optical device such as the optical waveguides are optically coupled with the optical coupler.

The optical apparatus allows the semiconductor optical device to support the optical part, such that the optical part is coupled to the optical coupler of the semiconductor optical device.

The optical apparatus further includes a second electrical component mounted on the back of the printed circuit board. The first electrical component is mounted on the front face of the printed circuit board, and the second electrical component is electrically connected to the semiconductor optical device on the printed circuit board.

The optical apparatus allows the printed circuit board to mount an electrical component on the surface of the second laminate structure in addition to the surface of the first laminate structure and to make electrical connection by use of one or more wiring layers in the printed circuit board.

The optical apparatus according to an embodiment further includes a heat dissipating part having a supporting surface. The supporting surface supports the second face of the metal piece in the second opening of the main body.

The optical device allows the heat dissipating part to support the second face of the metal piece in the printed circuit board and the first face of the metal piece to mount the semiconductor optical device.

In the optical apparatus according to an embodiment, the optical element of the semiconductor optical device includes at least one of a photo diode or a Mach-Zehnder modulator.

In the optical apparatus, the optical element and the circuit element generate heat during operation. The second opening of the second laminate structure extending to the second face of the metal pieces in the printed circuit board allows the heat to propagate though the second face of the metal pieces.

A printed circuit board according to an embodiment includes: a first laminate structure including a first dielectric core layer, and a first metal layer for grounding or wiring, and the first metal layer is disposed on the first dielectric core layer, the first laminate structure having a second opening; a second laminate structure including a first dielectric core layer, and a first metal layer for grounding or wiring, and the first layer being disposed on the first dielectric core layer, the first laminate structure having a second opening, and a metal piece having a first face and a second face opposite to the first surface; the first laminate structure, the metal piece and the second laminate structure being arranged in the direction of the first axis, the first opening passing through the first laminate structure, and the second opening passing through the second laminate structure, the first opening having a first side extending in the direction of the first axis, the second opening having a second side extending in the direction of the first axis, the printed circuit board having a supporting face connecting the first side and the second side with each other, the supporting face supporting the second face of the metal piece in the first opening, and the second opening extending in a direction of a first axis to the second face of the metal piece, and the first laminate structure including pad electrodes arranged along an edge of the first opening on a surface of the first laminate structure.

The printed circuit board includes a structure comprising the first laminate structure and the second laminate structure, and provides the structure with a supporting surface extending in the direction of the second axis intersecting the direction of the first axis, and the support surface supports the second face of the metal piece. The metal piece can be used to mount the semiconductor device on the first face thereof. The first laminate structure includes pad electrodes arranged around the first opening on the surface of the first laminate structure, and allows the pad electrodes to connect with the semiconductor optical device mounted on the first face of the metal piece in the first opening. The second opening extending from the face of the second laminate structure to the second face of the metal pieces allows the heat, which is generated by the semiconductor optical devices on the first face of the metal piece, to propagate through the second face of the metal piece.

The teachings of the present invention can be readily understood by considering the following detailed description with reference to the accompanying drawings shown as examples. Referring to the accompanying drawings, embodiments of an optical apparatus, a printed circuit board, a method for fabricating a printed circuit board, and a method for fabricating an optical apparatus according to the aspects of the present invention will be illustrated below. When possible, the same portions will be denoted by the same reference numerals.

Figure 2:
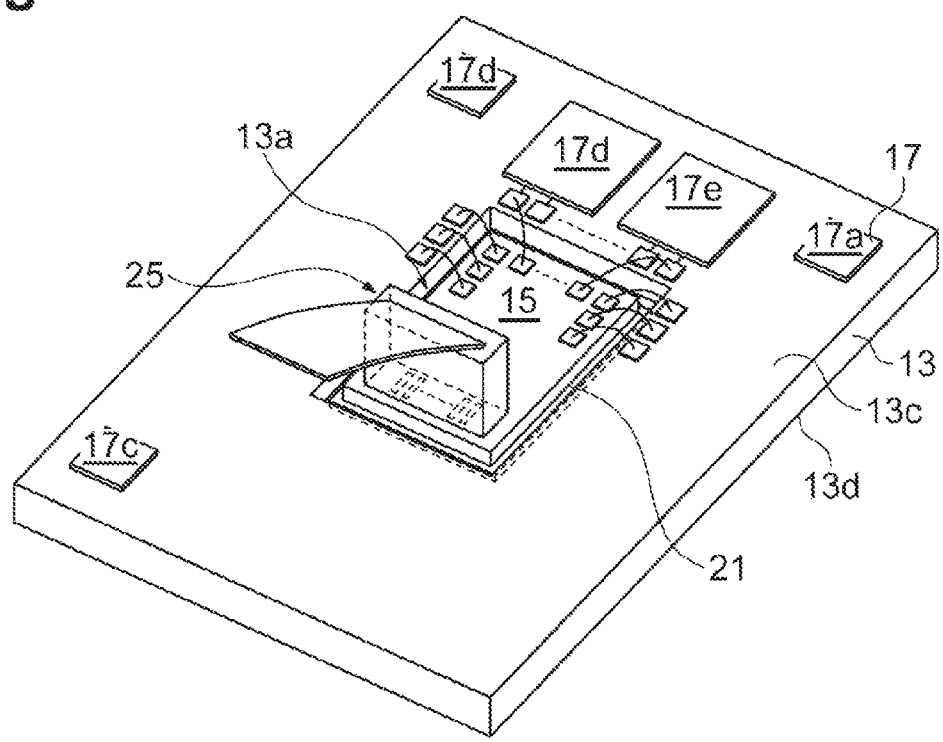
FIG. 2 is a schematic view showing an optical apparatus, which has been connected to an optical part, according to the present embodiment.
Figure 3:
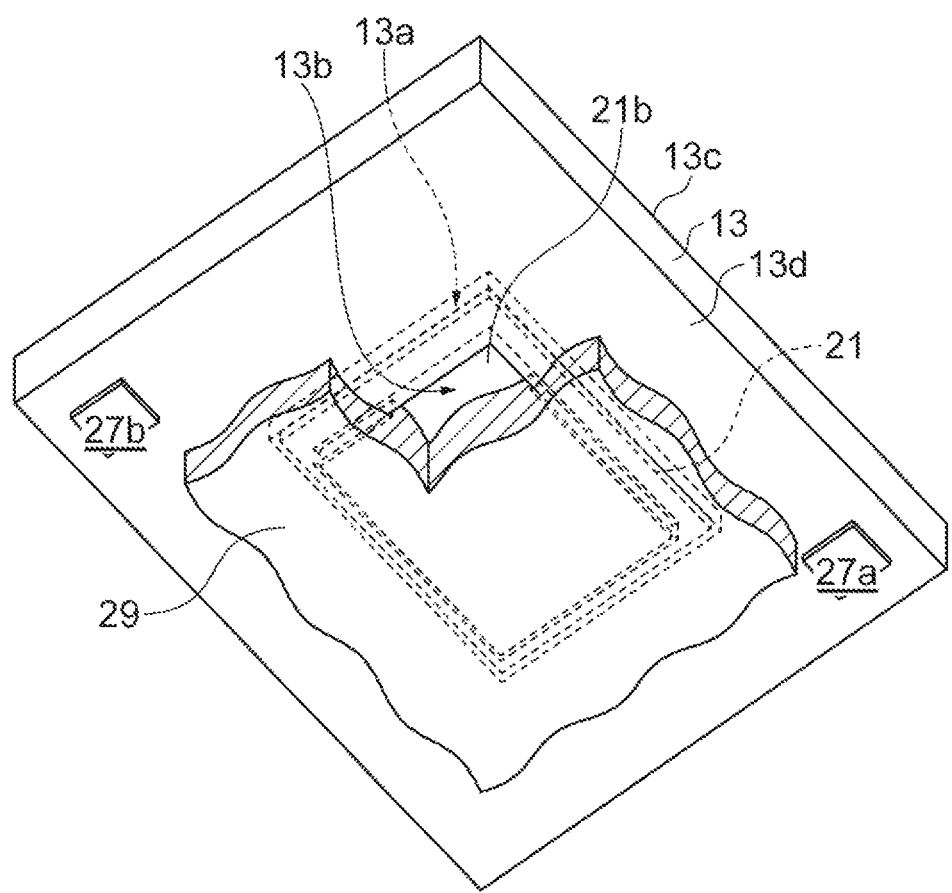
FIG. 3 is a schematic view showing an optical apparatus, which has been assembled with a supporting member, according to the present embodiment.
Figures 4A, 4B:
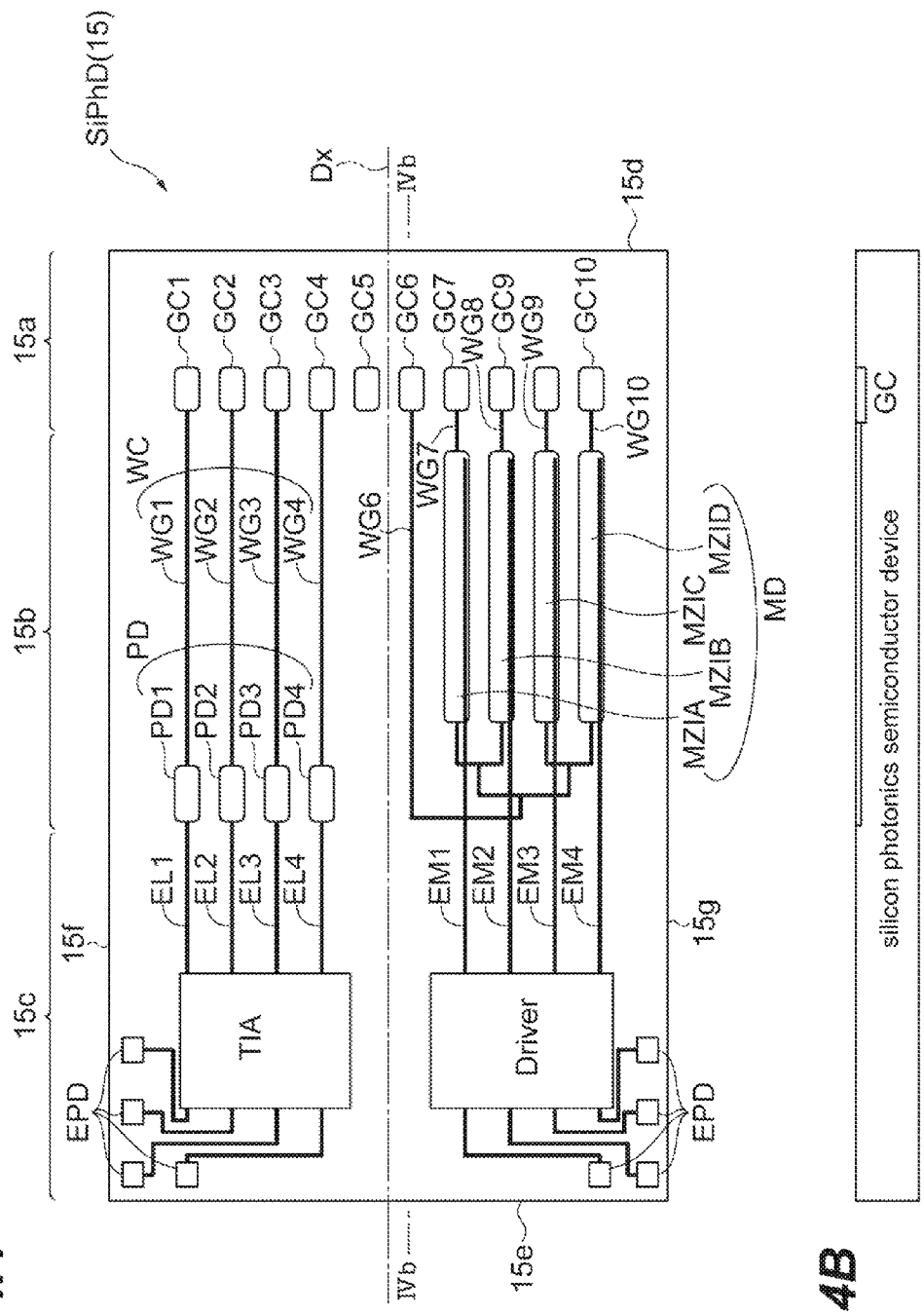
FIG. 4A is a plan view showing a silicon photonics semiconductor device.
FIG. 4B is a cross-sectional view, taken along the line IVb-IVb shown in FIG. 4A, showing the silicon photonics semiconductor device.

FIG. 1 is a schematic drawing showing an optical apparatus according to the present embodiment. FIG. 2 is a schematic drawing showing the optical apparatus to which the optical part is connected in the FIG. 1. FIG. 3 is a schematic drawing showing an optical apparatus which is fitted with a heat dissipating part. FIGS. 4A and 4B are schematic views each showing an exemplary semiconductor optical device for an optical apparatus according to the present embodiment. The optical apparatus 11 includes a printed circuit board 13, a semiconductor optical device 15 and a first electronic component 17. The printed circuit board 13 includes a main body (referred to as "body 19"), a first opening 13a and a second opening 13b provided in the body 19, and a metal piece 21 supported by the body 19. The printed circuit board 13 includes a plurality of wiring layers (L1, L2, L3, L4, L5, L6, L7, and L8) and a plurality of insulating layers (CR1, CR2, CR3, CR4, AD1H, AD2H, and AD3H). The metal piece 21 has a first face 21a and a second face 21b, and the first face 21a of the metal piece 21 is opposite to the second face 21b. The metal piece 21 may have a form of a thin metal plate or a metal foil. The printed circuit board 13 has a front face 13c and a back face 13d opposite to the front face 13c. The first opening 13a extends from the front face 13c to the first face 21a of the metal piece 21 in a direction of a first axis Ax1, and the second opening 13b extends from the back face 13d to the second face 21b of the metal piece 21 in the direction of the first axis Ax1. The first opening 13a has first sides 13e extending in the direction of the first axis Ax1, and second sides 13f extending in the direction of the first axis Ax1. The printed circuit board 13 includes a supporting face 13g extending in the directions of a second axis Ax2 and a third axis Ax3, both of which intersect with the first axis Ax1, to connect the bottom edge of the first sides 13e and the bottom edge of the second sides 13f with each other. The supporting face 13g supports the second face 21b of the metal piece 21 in the first opening 13a. The second opening 13b extends in the direction of the first axis Ax1 to reach the second face 21b of the metal piece 21. The semiconductor optical device 15 is mounted on the first face 21a of the metal piece 21 in the first opening 13a, and is electrically connected to the printed circuit board 13. The semiconductor optical device 15 includes one or more optical couplers, and an optical element(s) which processes light associated with the optical couplers, specifically light to/from the optical couplers, and a circuit element(s) which processes an electrical signal associated with the optical element, specifically an electrical signal to/from the optical element, which are integrated to form the monolithic or hybrid semiconductor device. The first electronic component 17 is mounted on the printed circuit board 13, and is electrically connected to the semiconductor optical device 15 via a conductor of the printed circuit board 13.

In the optical apparatus 11, the first opening 13a, the metal piece 21 and the second opening 21b are arranged in the direction of the first axis Ax1, such that the metal piece 21 is supported by the body 19 of the printed circuit board 13. The first opening 13a of the body 19 communicates with the second opening 13b thereof, and the body 19 has a supporting face 13g which connects the bottom edge of the first sides 13e with the bottom edge of the second sides 13f. This supporting face 13g supports the second face 21b of the metal piece 21. The arrangement of the first opening 13a, the metal piece 21 and the second opening 13b in the direction of the first axis Ax1 can restrict the location of the metal piece 21 to the axis on which the first opening 13a and the second opening 13b are arranged in the printed circuit board 13. This restriction in location of the metal piece 21 allows the printed circuit board 13 to incorporate the metal piece 21 on which the semiconductor optical device 15 is to be mounted, with no significant change of the printed circuit board 13 in thicknesses of insulating layers and widths of wiring layers, which may affect the electrical characteristics of the printed circuit board 13, in the body 19 of the printed circuit board 13. The metal piece 21 mounts the semiconductor optical device 15 on the first face 21a thereof in the first opening 13a such that the entire back side of the semiconductor optical device 15 is supported by the first face 21a. The second opening 13b extending to the second face 21b of the metal piece 21 allows the heat dissipation through the second face 21b of the metal piece 21.

Specifically, the body 19 of the printed circuit board 13 includes, in the present embodiment, a first dielectric core layer CR1, a second dielectric core layer CR2, a first insulating adhesive layer AD1H, a first metal layer L1, a second metal layer L2, a third metal layer L3, a fourth metal layer L4, another first dielectric core layer CR3, another second dielectric core layer CR4, another first insulating adhesive layer AD2H, another second insulating adhesive layer AD3H, another first metal layer L5, another second metal layer L6, another third metal layer L7, and another fourth metal layer L8. These dielectric core layers and insulating adhesive layers have respective dielectric constants and thicknesses which can provide the printed circuit board 13 with desired electrical characteristics. The first metal layer L1, the second metal layer L2, the third metal layer L3, the fourth metal layer L4, the other first metal layer L5, the other second metal layer L6, the other third metal layer L7, and the other fourth metal layer L8 have respective wiring widths which can provide the printed circuit board 13 with desired electrical characteristics. The first metal layer L1, the second metal layer L2, the third metal layer L3, the fourth metal layer L4, the other first metal layer L5, the other second metal layer L6, the other third metal layer L7, and the fourth metal layer L8 are disposed for wiring or common potential (e.g., grounding) on respective dielectric core layers or insulating adhesive layers. Each of these metal layers has a pattern for the provision of common potential (e.g., ground) or electrical connection. In the present embodiment, the first metal layer L1 is provided on the front face 13c of the printed circuit board 13, and the other fourth metal layer L8 is provided on the rear face 13d of the printed circuit board 13. For example, the first metal layer L1 is provided on the first dielectric core layer CR1; the other first metal layer L5 is provided between the other first dielectric core layer CR3 and the other first insulating adhesive layer AD2H, so that the other first insulating adhesive layer AD2H separates the other first metal layer L5 from the metal piece 21; the first dielectric core layer CR1 is provided so as to separate the first metal layer L1 from the second metal layer L2; the fourth metal layer L4 is provided between the second dielectric core layer CR2 and the other first insulating adhesive layer AD2H, so that the other second insulating adhesive layer AD2H is bonded to the first dielectric core layer CR2 so as to insulate the fourth metal layer L4 from the metal piece 21; the second dielectric core layer CR2 is provided so as to separate the third metal layer L3 from the fourth metal layer L4; the first insulating adhesive layer AD1H is provided so as to separate the second metal layer L2 from the third metal layer L3; and the metal piece 21 are isolated from the first metal layer L1, the second metal layer L2, the third metal layer L3, the fourth metal layer L4, the other first metal layer L5, the other second metal layer L6, the third metal layer L7, and the other fourth metal layer L8.

The first dielectric core layer CR1, the second dielectric core layer CR2, the other first dielectric core layer CR3, the other second dielectric core layer CR4 each include, for example, a glass epoxy resin. The metal layer L1, the second metal layer L2, the third metal layer L3, the fourth metal layer L4, the other first metal layer L5, the other second metal layer L6, the other third metal layer L7, and the other fourth metal layer L8 each include a thin metal film, such as, copper, aluminum, and magnesium. The first insulating adhesive layer AD1H, the other first insulating adhesive layer AD2H, and the other second insulating adhesive layer AD4H each includes, for example, prepreg, and the prepreg includes insulating resin composition and a support of porous material, and the porous material is impregnated with the insulating resin composition. The insulating resin composition comprises, for example, a glass epoxy resin and/or alumina.

Example.

Range of thickness TM of the metal piece 21: 0.1 to 0.6 millimeters.

Exemplary material of the metal piece 21: copper, aluminum, magnesium, iron (including stainless steel), and anodized aluminum.

The depth D1 of the first opening 13a: 700 to 800 micrometers.

The depth D2 of the second opening 13b: 200 to 2200 micrometers.

The thickness of the printed circuit board: 2 to 3 millimeters.

The thickness DV1 of the semiconductor optical device 15: 700 to 1100 micrometers.

Distance DS between the side of the semiconductor optical device 15 and the sides 13e of the first opening 13a: 200 to 700 micrometers.

The first sides 13e are made of an insulator, which may include, in particular, epoxy resin of the dielectric core layers and prepreg of the insulating adhesive layers. The second sides 13f of the second opening 13b are made of an insulator, which includes, in particular, epoxy resin of the dielectric core layers and prepreg of the insulating adhesive layers. The first metal layer L1, the second metal layer L2, the third metal layer L3, and fourth metal layer L4 are separated from the first sides 13e of the first opening 13a, and the other first metal layer L5, the other second metal layer L6, the other third metal layer L7, and the other fourth metal layer L8 are separated from the second sides 13f of the second opening 13b. The separation can prevent the metal piece 21 from coming in contact with any of the first metal layer L1, the second metal layer L2, the third metal layer L3, the fourth metal layer L4, the other first metal layer L5, the other second metal layer L6, the other third metal layer L7, and the other fourth metal layer L8. These metal layers in the body 19 are separated from the first sides 13e and the second sides 13f, for example, by a distance of 150 micrometers or more.

The metal piece 21 includes a first portion 21c and a second portion 21d. The first portion 21c surrounds the second portion 21d to form a stripe-shaped region outside the second portion 21d. The width of the stripe-shaped region may be, for example, 100 to 500 micrometers. The other first insulating adhesive layer AD2H and/or the other first dielectric core layer CR2 support the periphery of the metal piece 21, in particular, the first portion 21c. In order to allow the support, the first opening 13a has a size larger than that of the second opening 13b, where each of these sizes is defined as a cross-section taken along a plane perpendicular to the first axis Ax1. The supporting face 13g has a stripe-shape closed along the bottom edge of the second opening 13b to form a loop. Specifically, the semiconductor optical device 15 has a back side edge, which may be located outside the bottom edge of the second opening 13b on the second face 21b of the metal piece 21, allowing the supporting face 13g and the metal piece 21 to support the semiconductor optical device 15. Alternatively, the back side edge of the semiconductor optical device 15 may be located inside the bottom edge of the second opening 13b on the second face 21b of the metal piece 21, allowing the heat to dissipation through the entire back face of the semiconductor optical device 15.

The body 19 of the printed circuit board 13 includes a first laminate structure 19a and a second laminate structure 19b. The first laminate structure 19a is provided with the first opening 13a, and the first opening 13a passes through the first laminate structure 19a. The second laminate structure 19b is provided with the second opening 13b, and the second opening 13b passes through the second laminate structure 19b. The first laminate structure 19a, the metal piece 21 and the second laminate structure 19b are arranged in the direction of the first axis Ax1, such that the first opening 13a of the first laminate structure 19a and the second opening 13b of the second laminate structure 19b communicate with each other so as to form the supporting face 13g, which supports the metal piece 21. The first laminate structure 19a and the second laminate structure 19b in the printed circuit board 13 have respective internal structures, such as thicknesses of insulating layers and widths of wiring layers, which may affect the electrical characteristics of the printed circuit board 13, and the wiring layers and the insulating layers in the first laminate structure 19a and the second laminate structure 19b are disposed to circumvent the first opening 13a and the second opening 13b, respectively, so that the printed circuit board 13 can incorporate the metal piece 21 which may be used to mount a semiconductor device. The first opening 13a of the first laminate structure 19a can guide the metal piece 21 in position, and the second laminate structure 19b can support the periphery of the metal piece 21 (in particular, the first portion 21c) using the bottom face as the supporting face 13g because the sides of the second opening 13b are set inside with respect to the sides of the first opening 13a.

In the present embodiment, the first laminate structure 19a is provided with the first dielectric core layer CR1, the second dielectric core layer CR2, the first insulating adhesive layer AD1H, the first metal layer L1, the second metal layer L2, the third metal layer L3, and the fourth metal layer L4; and the second laminate structure 19b is provided with the first dielectric core layer CR3, the second dielectric core layer CR4, the first insulating adhesive layer AD2H, the second insulation adhesive layer AD3H, the first metal layer L5, the second metal layer L6, the third metal layer L7, and the fourth metal layer L8. The optical apparatus 11 includes the arrangement of the first laminate structure 19a, the metal piece 21 and the second laminate structure 19b in the direction of the first axis Ax1, such that the first laminate structure 19a and the second laminate structure 19b can support the metal piece 21. The first laminate structure 19a and the second laminate structure 19b in the printed circuit board 13 have wiring layers and insulating layers disposed to go round the first opening 13a and the second opening 13b, respectively, so that the printed circuit board 13 is provided with the metal piece 21, which is to mount the semiconductor optical device 15, with no significant changes of the printed circuit board 13 in thickness of the insulating layers and width of the wiring layers, which may affect the electrical characteristics of the printed circuit board 13, in the body 19 of the printed circuit board 13. This structure makes the fabrication of the printed circuit board 13 easy.

In order to make the body 19 of the printed circuit board 13 with desired uniformity and flatness, the dielectric core layers and the insulating adhesive layers have thicknesses of not more than respective upper limits. In addition, the upper limits relate to the widths of the metal layers. The limits for glass-epoxy resin used in the inventors' study are as follows: the thickness of the dielectric core layers is in the range of 60 to 1600 micrometers; and the thickness of the insulating adhesive layers is in the range of 30 to 200 micrometers. The glass-epoxy resin layers that are disposed between the uppermost and lowermost metal layers and respective underlying metal layers have a thickness of 150 micrometers, and glass-epoxy resin layers between the above underlying metal layers have a thickness of not more than 400 micrometers. The depth D1 of the first opening 13a and the depth D2 of the second opening 13b can be changed depending upon the thicknesses of the dielectric core layers and insulating adhesive layers.

(Example 1)
Metal layer (L1): 100 micrometers.
Dielectric core layer (CR1): 150 micrometers.
Metal layer (L2): 30 micrometers.
Insulating adhesive layer (AD1H): 400 micrometers.
Metal layer (L3): 20 micrometers.
Dielectric core layer (CR2): 200 micrometers.
Metal layer (L4): 40 micrometers.
Metal piece 21: 200 micrometers.
Insulating adhesive layer (AD2H): 200 micrometers.
Metal layer (L5): 40 micrometers.
Dielectric core layer (CR3): 200 micrometers.
Metal layer (L6): 20 micrometers.
Insulating adhesive layer (AD3H): 400 micrometers.
Metal layer (L7): 30 micrometers.
Dielectric core layer (CR4): 150 micrometers.
Metal layer (L8): 100 micrometers.
The depth of the first opening 13a: about 740 micrometers (100+150+30+400+20+200+40−200).
The depth of the second opening 13b: about 940 micrometers (40+200+20+400+30+150+100).

(Example 2)
Metal layer (L1): 100 micrometers.
Dielectric core layer (CR1): 150 micrometers.
Metal layer (L2): 30 micrometers.
Insulating adhesive layer (AD1H): 400 micrometers.
Metal layer (L3): 20 micrometers.
Dielectric core layer (CR2): 400 micrometers.
Metal layer (L4): 40 micrometers.
Metal piece 21: 400 micrometers.
Insulating adhesive layer (AD2H): 400 micrometers.
Metal layer (L5): 40 micrometers.
Dielectric core layer (CR3): 100 micrometers.
Metal layer (L6): 20 micrometers.
Insulating adhesive layer (AD3H): 100 micrometers.
Metal layer (L7): 30 micrometers.
Dielectric core layer (CR4): 150 micrometers.
Metal layer (L5): 100 micrometers.
The depth of the first opening 13a: about 740 micrometers (100+150+30+400+20+200+40−400).
The depth of the second opening 13b: about 540 micrometers (40+100+20+100+30+150+100).

(Example 3)
Metal layer (L1): 100 micrometers.
Dielectric core layer (CR1): 150 micrometers.
Metal layer (L2): 30 micrometers.
Insulating adhesive layer (AD3H): 200 micrometers.
Metal layer (L3): 20 micrometers.
Dielectric core layer (CR2): 150 micrometers.
Metal layer (L4): 40 micrometers.
Insulating adhesive layer (AD3H): 400 micrometers.
Metal layer (L5): 40 micrometers.
Dielectric core layer (CR3): 200 micrometers.
Metal layer (L6): 20 micrometers.
Metal piece 21: 600 micrometers.
Insulating adhesive layer (AD3H): 600 micrometers.
Metal layer (L7): 30 micrometers.
Dielectric core layer (CR4): 150 micrometers.
Metal layer (L8): 100 micrometers.
The depth of the first opening 13a: about 750 micrometers (100+150+30+200+20+150+40+400+40+200+20−600).
The depth of the second opening 13b: about 280 micrometers (30+150+100).

The optical apparatus 11 may further include an optical part 25 as shown in FIG. 2, and the optical part 25 includes a plurality of optical waveguides 25a, such as optical fibers, and a holder 25b for holding the optical waveguides 25a. The optical part 25 may comprise, for example, a pigtail-type optical connector and/or a fiber stub. The optical apparatus 11 allows the semiconductor optical device 15 to support the optical part 25 such that the optical part 25 is optically coupled to the optical couplers of the semiconductor optical device 15.

The body 19 includes a plurality of pad electrodes 23a, 23b, 23c, 23d, 23e, 23f, 23g, 23h, 23i, and 23j arranged along the edge of the first opening 13a, which receives the semiconductor optical device therein, on the front face (13c) of the body 19, and these pad electrodes (23a to 23j) are connected to the semiconductor optical device 15 via a connecting conductor, such as a bonding wire. In the printed circuit board 13, the body 19 (the first laminate structure 19a) can be provided with the pad electrodes (23a to 23j), arranged around the first opening 13a on the front face (13c), which allow electrical connection with the semiconductor optical device 15 mounted on the first face 21a of the metal piece 21. The second opening 13b extends from the back face (13d) of the second laminate structure 19b of the body 19 to the second face 21b of the metal piece 21, so that the second face 21b of the metal piece 21 allows the dissipation of heat generated by the semiconductor optical device 15 on the first face 21a of the metal piece 21.

For example, the depth D1 of the first opening 13a may be smaller than the thickness DV1 of the semiconductor optical device 15. The semiconductor optical device 15 is disposed on the first face 21a of the metal piece 21 in the first opening 13a, so that the optical apparatus 11 has a structure in which the top face of the semiconductor optical device 15 is made higher than the front face (13c) of the body 19 (in particular, the first laminate structure 19a). This structure makes it easy to electrically connect the printed circuit board 13 to the semiconductor optical device 15. The structure also makes it easy to connect the optical part 25 with the semiconductor optical device 15. Further, in die-bonding the semiconductor optical device 15 into the first opening 13a of the printed circuit board 13 with an adhesive agent, the structure prevents the adhesive agent, which accidentally overflows out of a gap formed between the sides of the semiconductor optical device 15 in the first opening 13a of the printed circuit board 13, from overhanging the top face of the semiconductor optical device 15.

Specifically, the optical apparatus 11 may include one or more first electronic components 17 (17a, 17b, 17c, 17d, 17e) mounted on the front face 13c of the printed circuit board 13 (the surface of the first laminate structure 19a). Further, the optical apparatus 11 may include second electronic component 27 (27a, 27b) mounted on the back face 13d of the printed circuit board 13 (the surface of the second laminate structure 19b). The first electronic components 17 and the second electronic component 27 are electrically connected to the semiconductor optical device 15 on the printed circuit board 13 directly or via an electronic component(s). The printed circuit board 13 including a multi-layer wiring substrate allows the mounting of electrical components on not only the face 13c of the printed circuit board 13 (the surface of the first laminate structure 19a) but also the back face 13d of the printed circuit board 13 (the surface of the second laminate structure 19b).

The optical apparatus 11 may further comprise a heat dissipating part 29 as shown in FIG. 3, and the heat dissipating part 29 includes a supporting face 29a, which can support the second face 21b of the metal piece 21, in the second opening 13b of the body 19. The metal piece 21 of the printed circuit board 13 is supported by the heat dissipating part 29 on the second face 21b thereof, and mounts the semiconductor optical device 15 on the first face 21a thereof.

The semiconductor optical device 15 may include one or more photodiodes and/or one or more Mach-Zehnder modulators, each of which works as the optical element, and a circuit element(s) which processes an electrical signal to/from the optical element. The optical element and the circuit element generate heat during operation. This heat can be released through the second face 21b of the metal piece 21 in the second opening 13b, reaching the second face 21b of the metal piece 21, of the body 19 of the printed circuit board 13. Specifically, the semiconductor optical device 15 may comprise a silicon photonics semiconductor device, which can perform the processing of optical signals and the processing of electrical signals.

FIGS. 4A and 4B show an exemplary silicon photonics semiconductor device for the optical apparatus according to the present embodiment. FIG. 4A is a plan view showing the silicon photonics semiconductor device, and FIG. 4B is a cross-sectional view, taken along the line IVb-IVb shown in FIG. 4A, showing the silicon photonics semiconductor device. Referring to FIG. 4A, the silicon photonics semiconductor device SiPhD includes an optical coupler, for example, grating couplers GC1, GC2, GC3, GC4, GC5, GC6, GC7, GC8, CG9, CG10 (e.g., the number of the couplers being 10), each of which acts as an optical coupler.

The grating couplers GC1 to CG4 are prepared for an optical receiver. Optical signals from the grating couplers GC1 to CG4 are supplied to a light-receiving element PD through an optical circuit WC. In the present embodiment, the optical circuit WC includes optical waveguides WG1 to WG4. The grating couplers GC1 to CG4 are optically coupled to the photodiodes PD1 to PD4 through optical waveguides WG1 to WG4, respectively. The photodiodes PD1 to PD4 are connected to an electrical circuit TIA (e.g. transimpedance amplifier) through conductive lines EL1 to EL4, respectively. The electrical circuit TIA performs the processing (such as, current-voltage conversion, and amplification) of electrical signals (e.g. photocurrent) from the photodiodes PD1 to PD4 to generate electrical signals corresponding to the received optical signals.

Further, the grating couplers GC6 to CG10 are prepared for an optical transmitter. In the present embodiment, a laser beam from the grating coupler GC6 is supplied to optical modulators MD. These optical modulators MD include, for example, Mach-Zehnder modulators MZIA, MZIB, MZIC, and MZID. The Mach-Zehnder modulators MZIA to MZID receive electrical signals EM1 to EM4 from a drive circuit Driver to generate modulated light beams in response to an the electrical signal EM1 to EM4, respectively. These modulated light beams propagate to the grating couplers GC7 to CG10 through the optical waveguides WG7 to WG10, respectively.

The silicon photonics semiconductor device SiPhD includes a first portion 15a, a second portion 15b and the third portion 15c, which are aligned arranged in a row, such as the direction of an axis Dx. The first portion 15a is provided with an arrangement of the grating couplers GC1 to CG10. The grating couplers GC1 to CG10 are arranged along a side 15d in the first portion 15a. Another side 15e opposite to the side 15d is in the third portion 15c. One end and another end of the side 15d and one end and another end of the other side 15e are connected by a first side 15f and a second side 15g, respectively, and the first side 15f and the second side 15g extend in the direction of the second axis Ax2, and the side 15d and the other side 15e extend in a direction intersecting with the second axis Ax2. The second portion 15b is provided with the optical element, such as a semiconductor light receiving element and/or an optical modulator. The third portion 15c is provided with the electric circuits, such as electric circuit TIA and drive circuit Driver, and the pad electrodes EPD for electrical circuits. The pad electrodes EPD are arranged in the other side 15e in the third portion 15c of the silicon photonics semiconductor device SiPhD, and if necessary, can be arranged on the first side 15f and/or the second side 15g. Alternatively, the pad electrodes EPD are arranged along the first side 15f and/or the second side 15g in the portion 15c of the silicon photonics semiconductor device SiPhD, and if necessary, may be arranged in the other side 15e.

FIGS. 5 to 14 are views each showing a major step in a method for producing a printed circuit board 13 and a method for producing the optical apparatus 11. With reference to FIGS. 5 to 14, major steps in the producing methods will be illustrated. If possible, the reference numerals of FIGS. 1 to 3 will be also used in the subsequent description.

The preparation step prepares a printed circuit board 13. In the present embodiment, in order to prepare the optical apparatus 11, the printed circuit board 13 is produced. In order to avoid complexity, a description on the method for producing a printed circuit board 13 will be given with reference to the drawings which depict a single section for a single printed circuit board to be produced.

Figure 5:
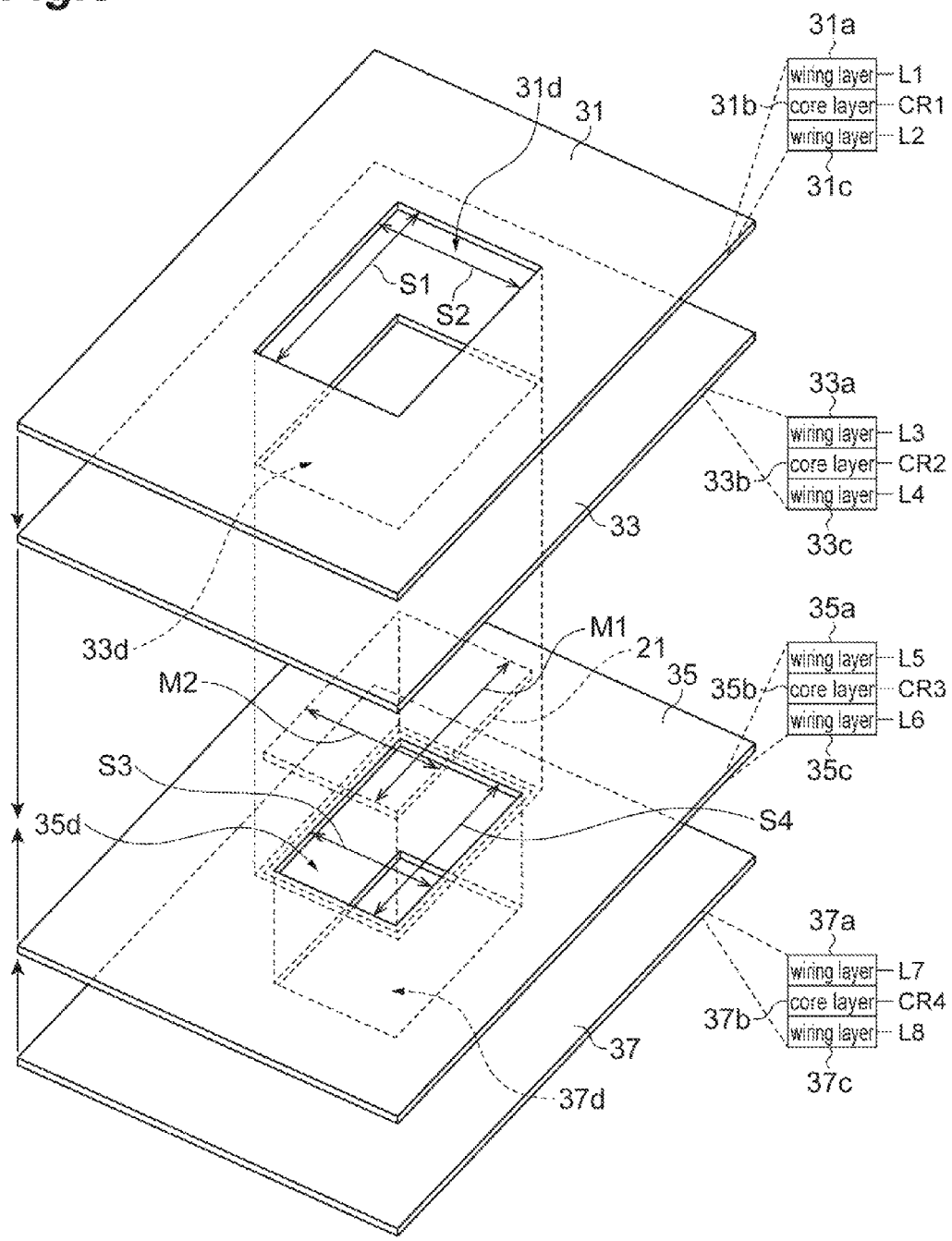
FIG. 5 is a schematic view showing a major step in a method for producing an optical apparatus according to the present embodiment.

In the method for fabricating the printed circuit board 13, the metal piece 21, and parts for laminate bodies each including a desired number of layers are prepared. As shown in FIG. 5, in the present embodiment, a first laminate body 31, a second laminate body 33, another first laminate body 35 and another second laminate body 37 are prepared. The first laminate body 31 includes a first metal layer 31a for wiring or grounding, a first dielectric core layer 31b, and a second metal layer 31c for wiring or grounding. The first metal layer 311a is disposed on the one side of the first dielectric core layer 31b, and the second metal layer 31c is disposed on the other side of the first dielectric core layer 31b. The second laminate body 33 includes a third metal layer 33a for wiring or grounding, a second dielectric core layer 33b and a fourth metal layer 33c for wiring or grounding. The third metal layer 33a is disposed on one side of the second dielectric core layer 33b, and the fourth metal layer 33c is disposed on the other side of the second dielectric core layer 33b. The other first laminate body 35 includes another first metal layer 35a for wiring or grounding, another first dielectric core layer 35b, and another second metal layer 35c for wiring or grounding. The other first metal layer 35a is disposed on one side of the other first dielectric core layer 35b, and the other second metal layer 35c is disposed on the other side of the other first dielectric core layer 35b. The other second laminate body 37 includes another third metal layer 37a for wiring or grounding, another second dielectric core layer 37b, and another fourth metal layer 37c for wiring or grounding. The other third metal layer 37a is disposed on one side of the other second dielectric core layer 37b, and the other fourth metal layer 37c is disposed on the other side of the other second dielectric core layer 37b.

The first laminate body 31, the second laminate body 33, the other first laminate body 35 and the other second laminate body 37 have a first opening 31d, a second opening 33d, another first opening 35d, and another second opening 37d, respectively. The first opening 31d has the same size as the second opening 33d, and the other first opening 35d has the same size as the other second opening 37d. In the present embodiment, the first opening 31d and the second opening 33d have the same size, and may have a shape of, for example, square or rectangular. These openings have a length in the first direction (e.g., longitudinal direction), which is referred to as "S1", and the openings have a length in the second direction perpendicular to the first direction (e.g., traverse direction), which is referred to as "S2". The other first opening 35d and the other second opening 37d may have the same size, and may have a shape of, for example, square or rectangular. These openings have a length in the first direction (e.g., longitudinal direction), which is referred to as "S3", and the openings have a length in the second direction perpendicular to the first direction (e.g., traverse direction), which is referred to as "S4".

In the present embodiment, the metal piece 21 may have a shape of, for example, square or rectangular. The metal piece 21 is not to be assembled in the present step, and for ease of understanding, the metal piece 21 is indicated by a dash line in FIG. 5 in order to show the metal piece 21 with reference to the shape and size of the first opening 31d, the second opening 33d, the other first openings 35d and the other second opening 37d with. The length of the metal piece 21 in the first direction (e.g., longitudinal direction) is referenced as the "M1," and the length of the metal piece 21 in the second direction perpendicular to the first direction (e.g. traverse direction) is referred to as "M2". These lengths meet the following magnitude relationship: S1>M1>S3 and S2>M2>S4. Further, the metal layers in each of the laminate bodies are separated from the sides of the openings, and the separation distance may be, for example, 200 micrometers or more. This separation can prevent the metal layers in the individual laminate bodies from coming into contact with the metal piece 21 in subsequent pressing step accidentally.

The first metal layer 31a and the second metal layer 31c in the first laminate body 31 have respective patterns to provide electrical connections required in the printed circuit board to be formed. Further, the first dielectric core layer 31b includes one or more first through-holes, which are arranged so as to make electrical connections required in the printed circuit board to be formed, in addition to the first opening 31d which pass through the first dielectric core layer 31b, and the first through-holes connect the metal layer 31a and the second metal layer 31c with each other. The second laminate body 33 also has the same structure as the first laminate body 31, except for the specific patterns and arrangements.

The other first metal layer 35a and the other second metal layer 35c in the other first laminate body 35 have respective patterns to provide electrical connections required in the printed circuit board to be formed. The other first dielectric core layer 35b also has second through holes, which are arranged so as to provide electrical connections required in the printed circuit board to be formed, in addition to the other first opening 35d which pass through the other first dielectric core layer 35b, and the second through holes connect the other first metal layer 35a and the other second metal layer 35c with each other. The other second laminate body 37 may also have the same structure as the other first laminate body 35, except for the specific patterns and arrangements.

Figure 6:
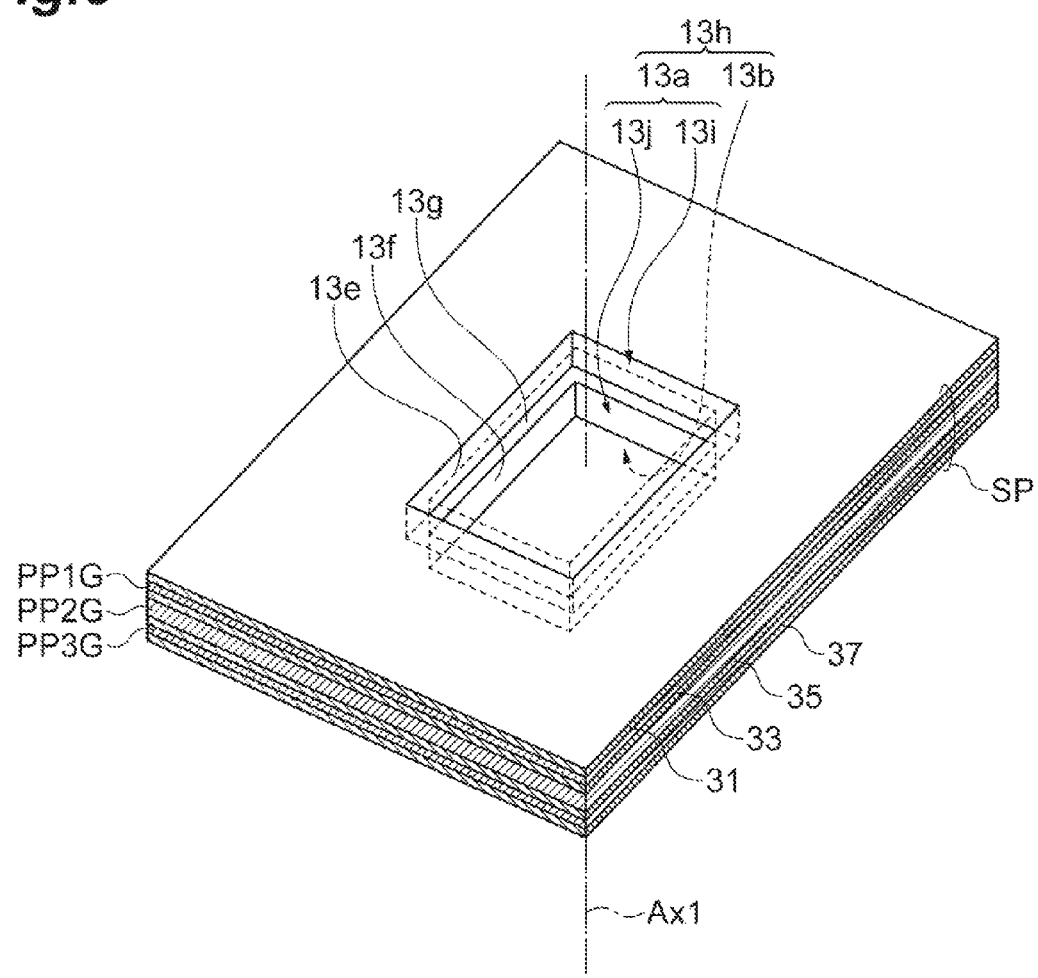
FIG. 6 is a schematic view showing a major step in the method according to the present embodiment.

With reference to FIG. 6, an arranging step is shown. The laminate body 31, the second laminate body 33, the other first laminate body 35 and the other second laminate body 37 are arranged in order in the direction of the first axis to form a product SP including the arrangement of the first laminate body 31, the second laminate body 33, the other first laminate body 35 and the other second laminate body 37. A first resin adhesive layer PP1G, a second resin adhesive layer PP2G, a third resin adhesive layer PP3G are disposed between corresponding two laminate bodies among the above laminate bodies. These resin adhesive layers may include, for example, a prepreg, and the prepreg includes insulating resin composition and a support of porous material, and the porous material is impregnated with the insulating resin composition. The resin adhesive layer is away from the sides of the respective openings that the first laminate body 31, the second laminate body 33, the other first laminate body 35 and the other second laminate body 37 have. This separation can prevent the insulating resin compositions from transuding to the openings in subsequent pressing step. The separation distance may be, for example, 200 micrometers or more. In the product SP, the first opening 31d of the first laminate body 31 and the second opening 33d of the second laminate body 33 communicate with each other to constitute the first opening 13a extending in the direction of the first axis Ax1. The other first opening 35d of the other first laminate body 35 and the other second opening 37d of the other second laminate body 37 communicate with each other to constitute the second opening 13b extending in the direction of the first axis Ax1. The first opening 31d of the first laminate body 31, the second opening 33d of the second laminate body 33, the other first opening 35d of the other first laminate body 35 and the other second opening 37d of the other second laminate body 37 that communicate with each other form a single opening 13h extending in the direction of the first axis Ax1. The opening 13h has a step in the middle thereof, and this step forms the supporting face 13g. The first opening 13a includes a first portion 13i and a second portion 13j, and the first portion 13i terminates at the supporting face 13g, and the second portion 13j communicates with the second opening 13b.

Figure 7A:
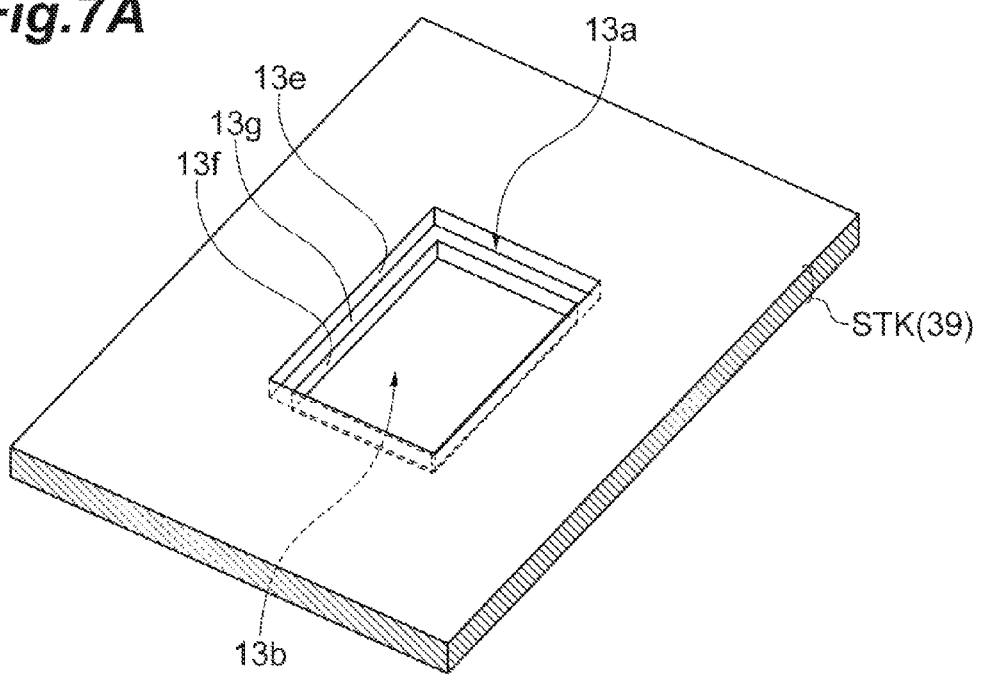
FIGS. 7A and 7B are schematic views showing a major step in the method according to the present embodiment.
Figure 7B:
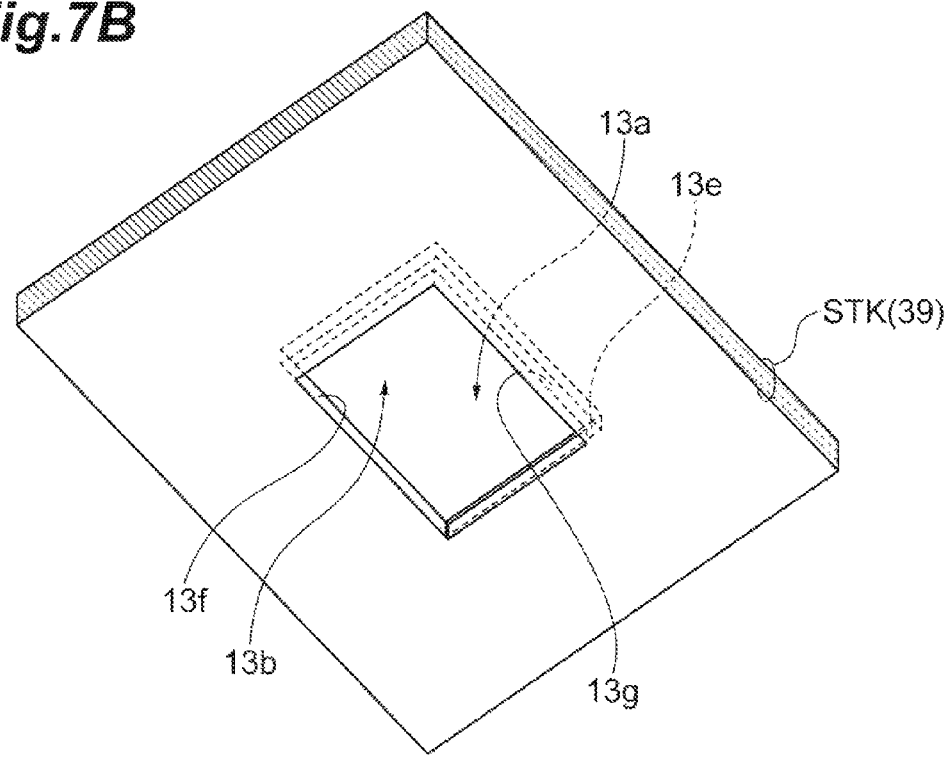

With reference to FIGS. 7A and 7B, a pressing step will be illustrated. After the first and second laminate bodies 31 and 33 and the other first and second laminate bodies 35 and 37 are stacked, the product SP is pressed. The pressing allows the first laminate body 31, the first resin adhesive layer PP1G, the second laminate body 33, the second resin adhesive layer PP2G, the other first laminate body 35, the third resin adhesive layer PP3G and the other second laminate body 37 to form an integrated product, thereby providing a stack STK for the printed circuit board 13. If needed, a stacking body 39 for a single printed circuit board is produced from the stack STK. In the stacking body 39, the openings of the first and second laminate bodies 31 and 33 together constitute the first opening 13a, and the openings of the other first and second laminate bodies 35 and 37 together constitute the second opening 13b.

Figure 8:
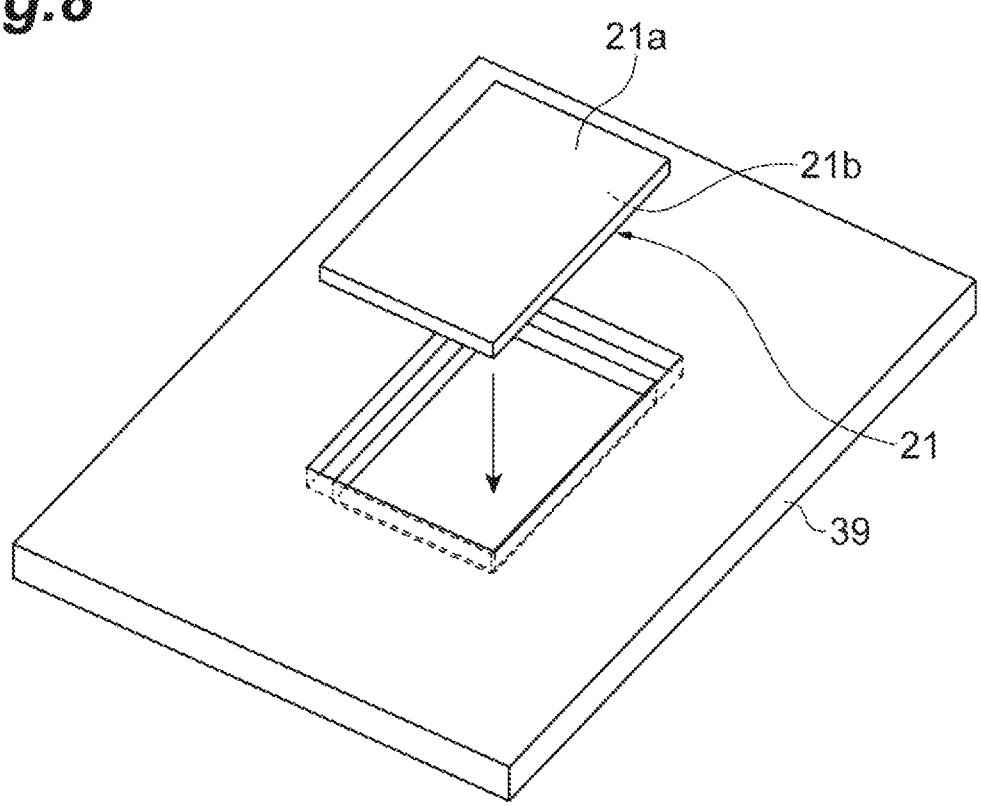
FIG. 8 is a schematic view showing a major step in the method according to the present embodiment.
Figure 9:
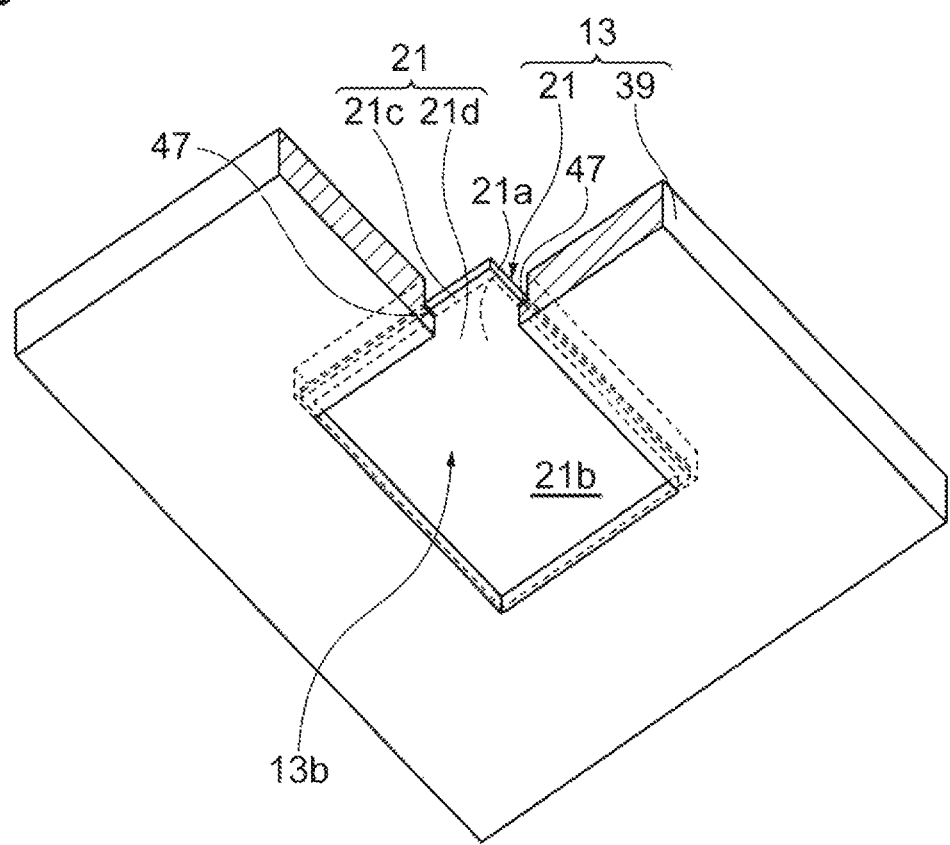
FIG. 9 is a schematic view showing a major step in the method according to the present embodiment.

In the arranging step carried out after the pressing step, as shown in FIG. 8, the metal piece 21 prepared is positioned to the first opening 13a of the stacking body 39 (the stack STK). After the positioning, as shown in FIG. 9, the metal piece 21 is inserted into the first opening 13a of the stacking body 39. The supporting face 13g is supported by the second face 21b of the metal piece 21, and in particular, the entire first portion 21c of the metal piece 21 is supported by the support face 13g. In order to fix the metal piece 21 to the stacking body 39, the following material for an adhesive 47 can be used: epoxy resin. The adhesive material 47 is to be supplied in an amount determined so as to prevent excess adhesive running into the first face 21a from covering all or most of the first face 21a. Preferably, the metal piece 21 may be bonded to the supporting face 13g such that the solidified adhesive 47 forms a fillet in a region between the supporting face 13g and the edge of the first face 21a of the metal piece 21 in order to obtain both the avoidance of the above running-into and the adequate bonding strength. The formation of to fillet allows the solidified adhesive 47 to trail from the edge of the first face 21a of the metal piece 21 to the supporting face 13g. An exemplary technique for forming a fillet is as follows: the metal piece 21 is placed in the first opening 13a and an amount of adhesive is applied around the metal piece 21 by means of the assembly tool, such as an injection needle. Adjusting the viscosity of the adhesive allows the applied adhesive to penetrates between the support face 13g and the second face 21b of the metal piece 21, so that the fillet can be formed in an area which is not covered with the metal piece 21 (a part of the supporting face 13g). On the supporting face 13g, the distance between the metal piece 21 and the first side 13e may be, for example, about 100 to 500 micrometers. The second opening 13b extends in the direction of the first axis Ax1 to reach the second face 21b of the metal piece 21. The bonding may be carried out through the first opening 13a to prevent the adhesive material from covering the second face 21b of the metal piece 21 located in the first opening 13a. These processes complete preparing the printed circuit board 13e.

The above method can produce the product SP with the laminated structures. The product SP is provided with the first laminate body 31, the second laminate body 33, the metal piece 21, the other first laminate body 35 and the other second laminate body 37, which are disposed along the first axis Ax1. In the product SP, the first opening 35d of the other first laminate body 35 and the second opening 37d of the other second laminate body 37 are arranged in alignment with the arrangement of the first opening 31d of the first laminate body 31 and the second opening 33d of the second laminate body 33. The first opening 13a can be used for the mounting of the semiconductor device, whereas the second opening 13b can be used for heat dissipation by use of the heat dissipating part 29. In the printed circuit board 13, the second laminate structure 19b supports the metal piece 21 located in the opening of the first laminate structure 19a. The metal piece 21 can provide the semiconductor device with a heat dissipation path along with a support for mounting the semiconductor device. Insulating material of the printed circuit board 13 is not on the heat dissipation path.

Carrying out these processes completes preparing the printed circuit board 13. As shown in FIG. 1, the printed circuit board 13 includes a stack having the first laminate structure 19a and the second laminate structure 19b, and the cavity for the metal piece 21 that is guided by the first laminate structure 19a and supported by the second laminate structure 19b. The first opening 13a and the second opening 13b each have a shape of substantially four sides, for example, a quadrilateral, such as a rectangle or square, at the respective surface of the laminate structures. Each quadrilateral has a first side 13aa and a second side 13ab, which extend in the direction of the second axis Ax2 intersecting with the direction of the first axis Ax1, and a third side 13ac and a fourth side 13ad extending in the direction of the third axis Ax3 intersecting with the directions of the first axis Ax1 and the second axis Ax2.

Figure 10:
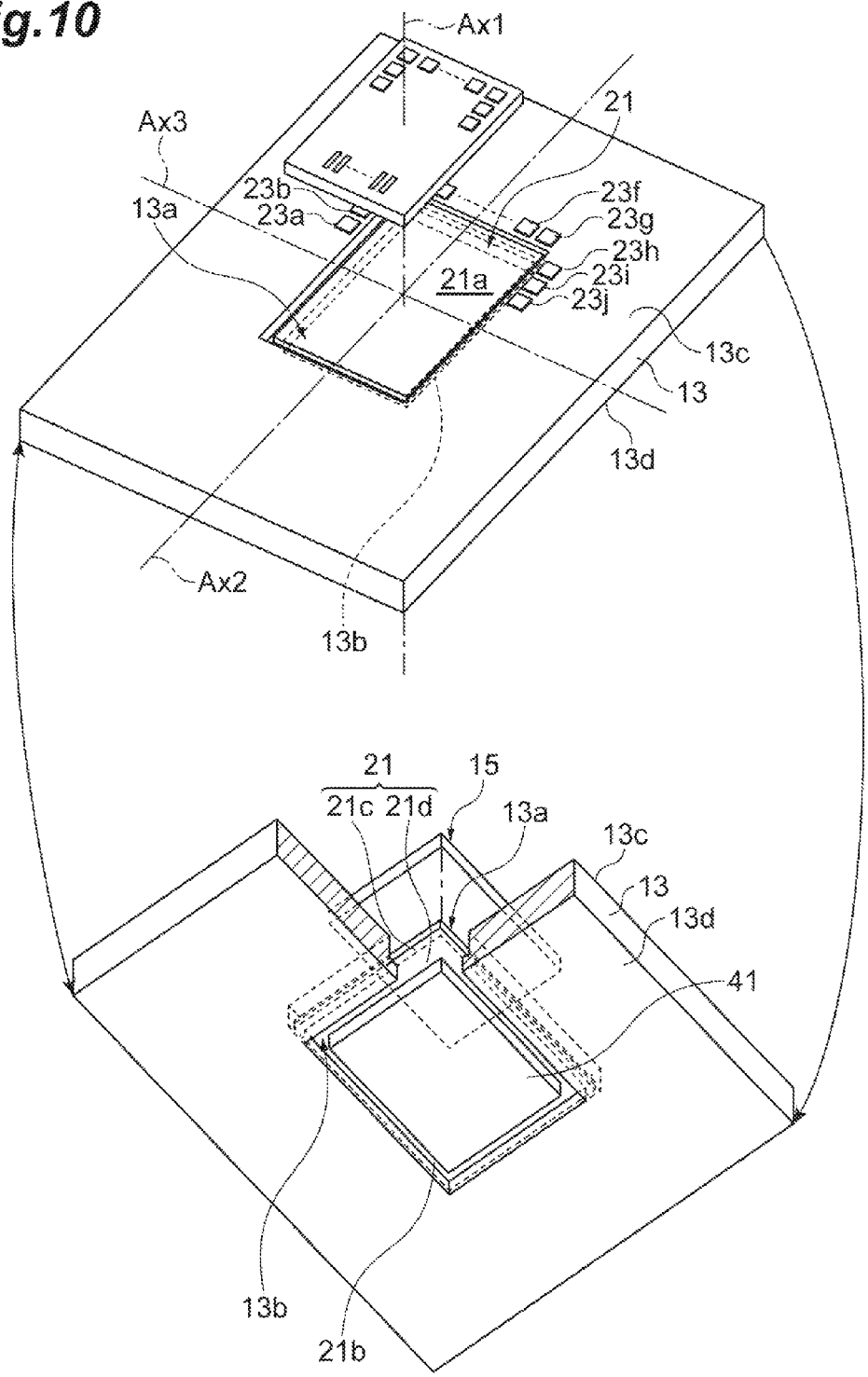
FIG. 10 is a schematic view showing a major step in the method according to the present embodiment.

In the mounting process, as shown in FIG. 10, the semiconductor optical device 15 is oriented in the direction of the second axis Ax2 and aligned with the orientation (the device axis Dx in FIGS. 4A and 4B) of the printed circuit board 13, and the semiconductor optical device 15 thus aligned is die-bonded onto the metal piece 21 in the first opening 13a of the printed circuit board 13. In order to oppose a pressing force at the die bonding, the metal piece 21 is supported by a supporting jig 41 in the second opening 13b of the printed circuit board 13 to avoid damage to the metal piece 21. The semiconductor optical device 15 is bonded to the metal piece 21 by an adhesive material 45, such as silicone grease, and silver paste.

Figure 11:
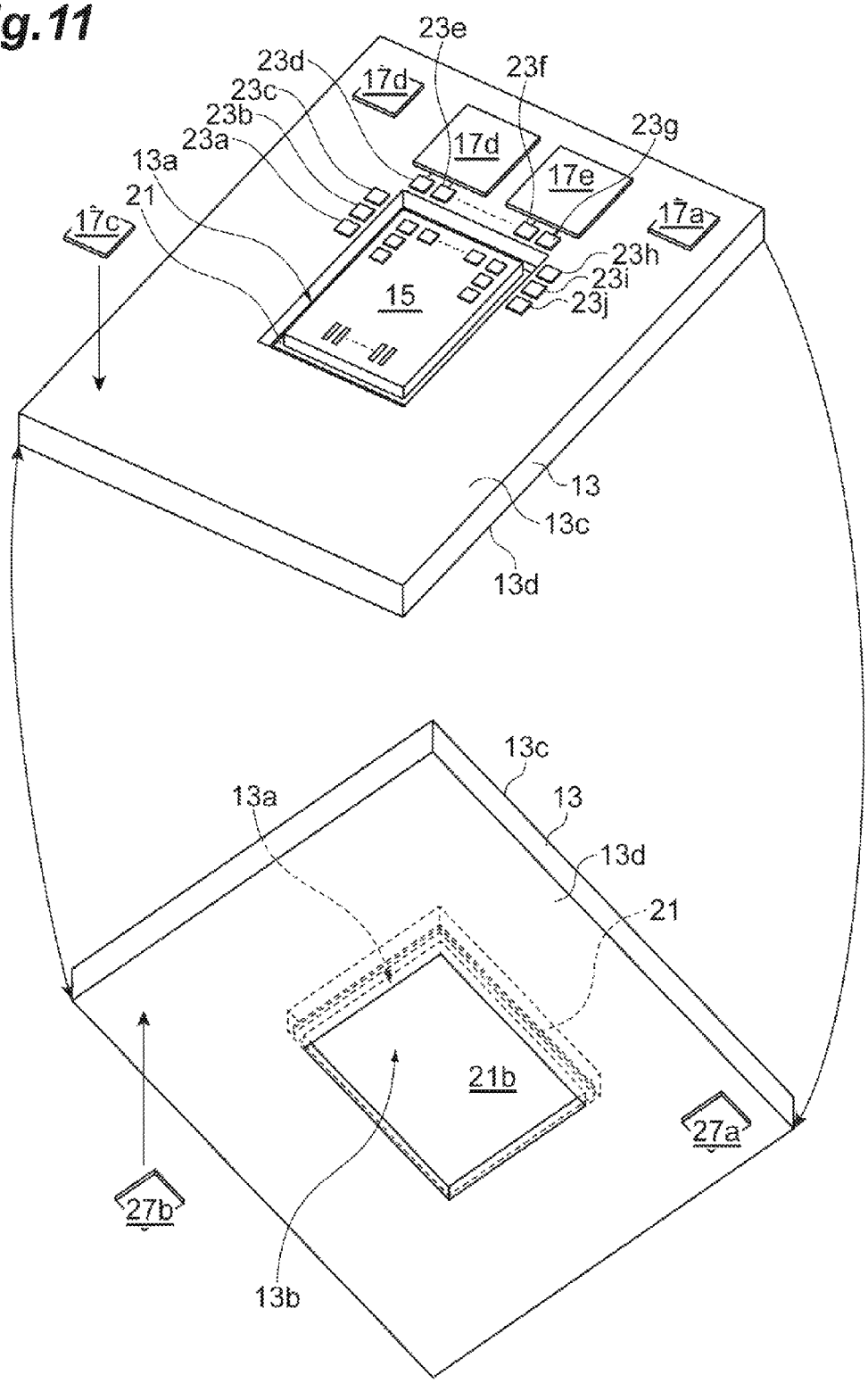
FIG. 11 is a schematic view showing a major step in the method according to the present embodiment.

Further, as shown in FIG. 11, the first electronic component 17 is mounted on the front face 13c of the printed circuit board 13, and the second electronic component 27 is mounted on the back face 13d of the printed circuit board 13.

Figure 12:
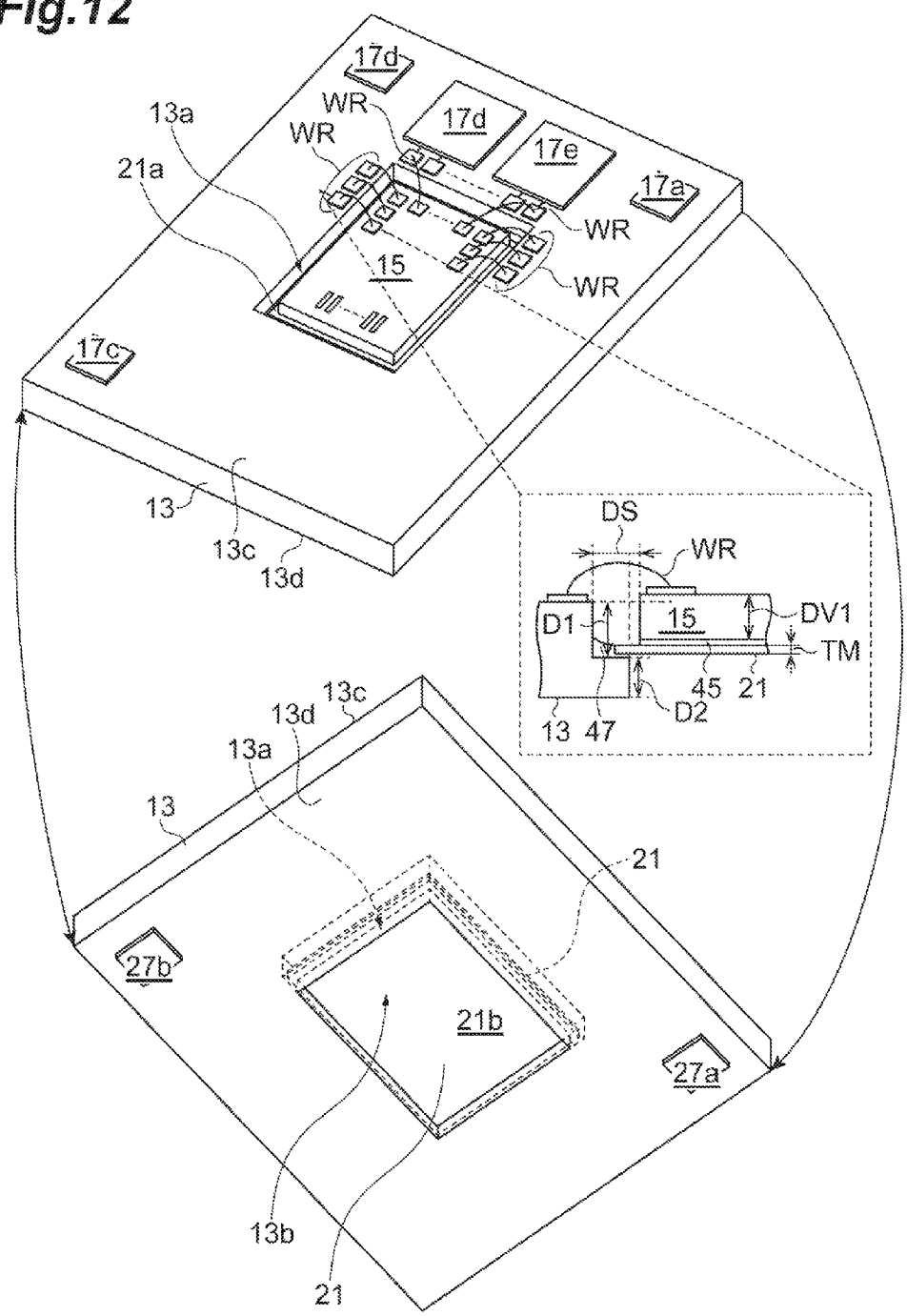
FIG. 12 is a schematic view showing a major step in the method according to the present embodiment.

In the electrical connecting step, as shown in FIG. 12, the pad electrodes EPD of the semiconductor optical device 15 thus mounted are connected to conductors, for example pad electrodes 23a to 23j, on the mounting face of the printed circuit board 13 by conductive lines to make electrical connection. As shown in FIG. 12, the solidified adhesive 47 trails from the edge of the first face 21a of the metal piece 21 to the supporting face 13g and the sides of the first opening 13a to form a fillet therein.

The first opening 13a and the second opening 13b of the printed circuit board 13 reach the first face 21a and the second face 21b of the metal piece 21, respectively. The first face 21a exposed at the first opening 13a can be used for mounting a semiconductor device, and the second face 21b opposite to the first face 21a can be used for heat dissipation through the heat dissipating part 29, which is mounted in the second opening 13b in a later step, to provide the semiconductor optical device 15 with a major heat dissipation path. The major heat dissipation path does not go through any insulating region of the printed circuit board 13. The metal piece 21 supported by the second laminate structure 19b in the first opening 13a supports the semiconductor device in the recess provided by the first laminate structure 19a. The semiconductor device thus mounted in the recess can lower the maximum height of a bonding wire WR connecting the semiconductor optical device 15 with the conductor of the printed circuit board 13. In order to avoid increase in the length of the bonding wire WR, the distance DS between the side of the semiconductor optical device 15 and the sides of the first opening 13a may be 100 micrometers or less.

Figure 13:
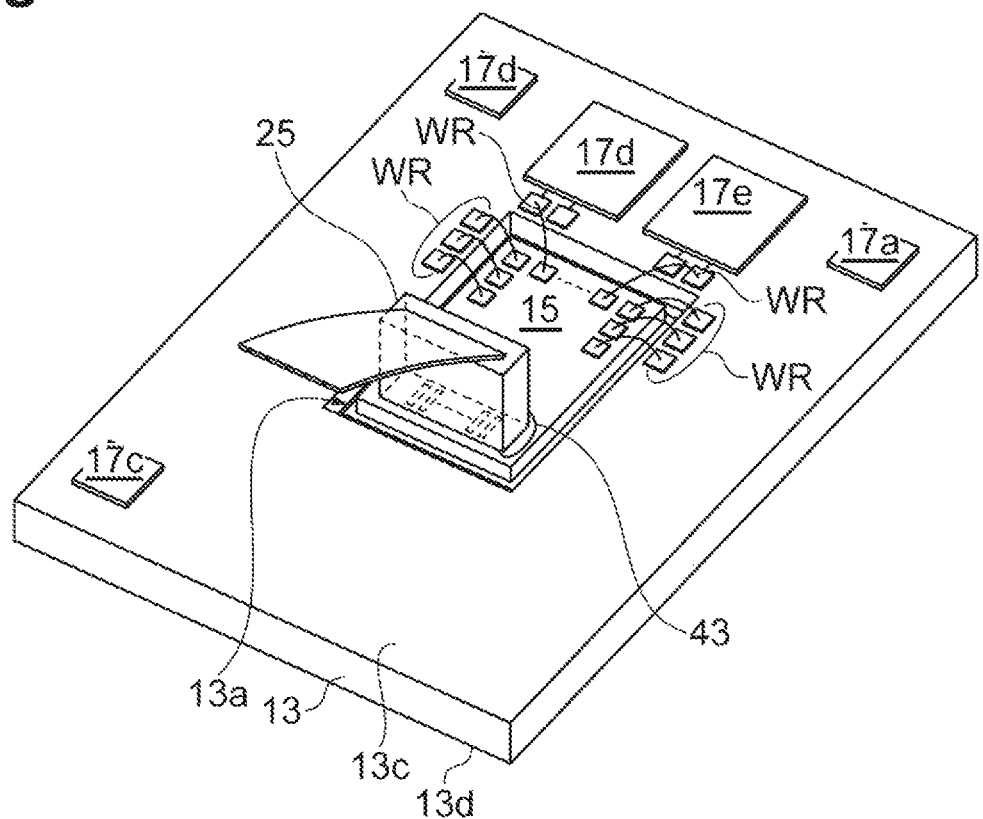
FIG. 13 is a schematic view showing a major step in the method according to the present embodiment.

In the connection process of the optical part, as illustrated in FIG. 13, the optical part 25 is prepared. The optical part 25 is optically connected with the optical couplers of the semiconductor optical device 15 mounted on the printed circuit board 13. The optical part 25 encompasses a stub, an optical connector, or both. In order to secure the optical part 25 to the upper face of the semiconductor optical device 15, an adhesive member 43 can be used. In connecting the optical part 25 with the optical apparatus, the semiconductor optical device 15 mounted in the recess can reduce the occurrence of accidental contact between the bonding wire WR, which connecting the semiconductor optical device 15 with the conductor of the printed circuit board 13, and the optical part 25. Further, the top of the semiconductor optical device 15 is made slightly higher with respect to the front face 13c of the printed circuit board 13, allowing the optical part 25 to be easily attached to the front face of the semiconductor optical device 15.

Figure 14:
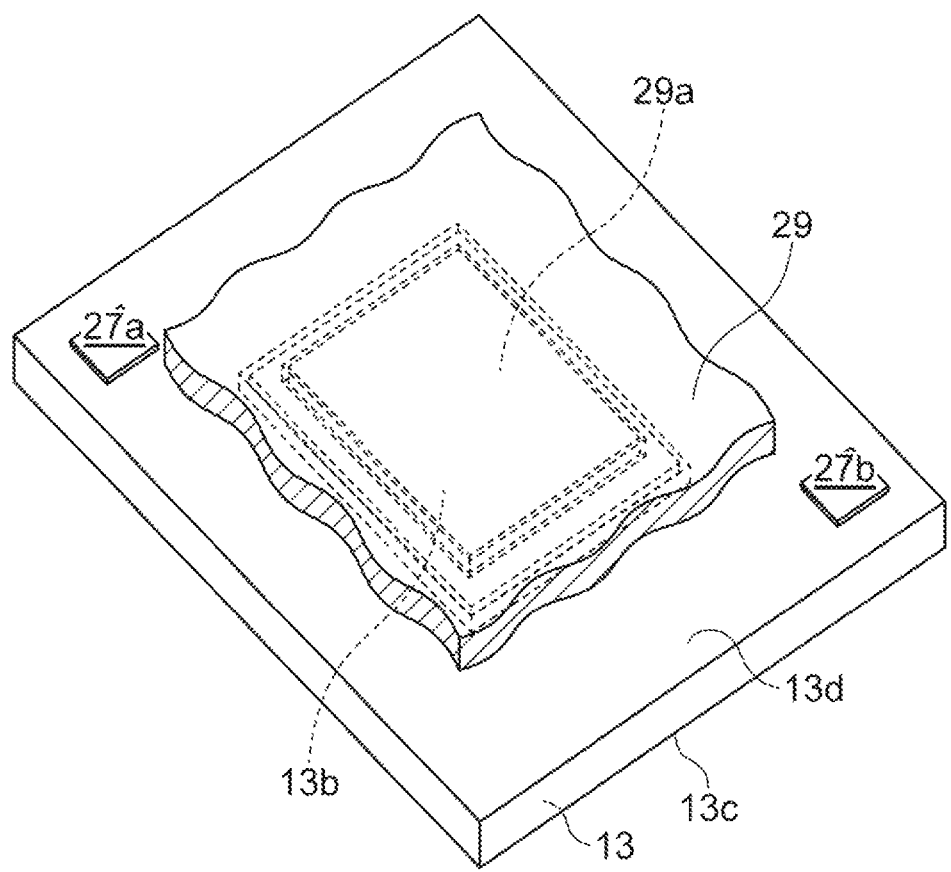
FIG. 14 is a schematic view showing a major step in the method according to the present embodiment.

In the step of mounting a heat sink, as shown in FIG. 14, the heat dissipating part 29 for a heat sink is mounted on a back face 13d of the printed circuit board 13. The heat dissipating part 29 has a size allowing the heat dissipating part 29 to reach the second face 21b of the metal piece 21 positioned in the bottom of the second opening 13b of the printed circuit board 13, and also has a support face (a support surface 29a shown in FIG. 3) allowing the heat dissipating part 29 to come in contact with the second face 21b of the metal piece 21. The heat dissipating part 29 may include, for example, copper, aluminum, silver, magnesium, anodized aluminum, and/or ceramics. Heat generated by the semiconductor optical device 15 propagates through the dissipating path in the second opening 13b, which is different from a pass via the insulating portion of the printed circuit board 13, specifically, a pass from the semiconductor optical device 15 on the first face 21a through the metal piece 21 to the second face 21b that is in contact with the heat dissipating part 29, and the heat travels in the direction from the first face 211a of the metal piece 21 to the second face 21b, i.e., the thickness direction, through the metal piece 21. If necessary, an adhesive agent may be used to attach the heat dissipating part 29 to the second face 21b.

In the present embodiment, the printed circuit board 13 has a single opening consisting of the first opening 13a and the second opening 13b, but includes another opening having substantially the same shape.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. An optical apparatus including:
   a semiconductor optical device integrating an optical coupler, an optical element for processing a light beam associated with the optical coupler, and an electrical circuit for processing an electrical signal associated with the optical element;
   a printed circuit board electrically connected with the semiconductor optical device, the primed circuit board including a main body and a metal piece, the main body having a first opening and a second opening, the metal piece having a first face and a second face, and the second face being opposite to the first face; and
   a first electrical component mounted on the printed circuit board, the first opening, the metal piece and the second opening being arranged in a direction of a first axis, the metal piece being supported by the main body of the printed circuit board,
   the printed circuit board including a front face and a back face, the back face being opposite to the front face, the first opening extending from the front face along the direction of the first axis, the second opening extending from the back face along the direction of the first axis, the first opening having a first side extending in the direction of the first axis, the second opening having a second side extending in the direction of the first axis, the main body of the printed circuit board having a supporting face connecting the first side and the second side with each other, the supporting face supporting the second face of the metal piece in the first opening, and the second opening extending along the direction of the first axis to the second face of the metal piece,
   the semiconductor optical device being mounted on the first face of the metal piece in the first opening, and
   the first electrical component being electrically connected to the semiconductor optical device via a conductor of the printed circuit board.

2. The optical apparatus according to claim 1, wherein the printed circuit board includes a first laminate structure and a second laminate structure, the first laminate structure, the metal piece and the second laminate structure being arranged in the direction of the first axis, the first opening passing through the first laminate structure, and the second opening passing through the second laminate structure, the first laminate structure includes a dielectric core layer, and a metal layer for grounding or wiring that is disposed on the dielectric core layer of the first laminate structure, and the second laminate structure includes a dielectric core layer, and a metal layer for grounding or wiring that is disposed on the dielectric core layer of the second laminate structure.

3. The optical apparatus according to claim 1, further including an optical part having optical waveguides, and a holder holding the optical waveguides, wherein the optical part is supported by the semiconductor optical device such that the optical waveguides are optically coupled with the optical coupler.

4. The optical apparatus according to claim 1, further including a second electrical component mounted on the back face of the printed circuit board, wherein the first electrical component is mounted on the front face of the printed circuit board, and the second electrical component is electrically connected to the semiconductor optical device on the printed circuit board.

5. The optical apparatus according to claim 1, further including a heat dissipating part having a supporting face, the supporting face supporting the second face of the metal piece in the second opening of the main body.

6. The optical apparatus according to claim 1, wherein the optical element of the semiconductor optical device includes at least one of a photo diode or a Mach-Zehnder modulator.

* * * * *